United States Patent
Kim

(10) Patent No.: US 9,190,123 B2
(45) Date of Patent: Nov. 17, 2015

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Min Su Kim, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/176,837

(22) Filed: Feb. 10, 2014

(65) Prior Publication Data

US 2015/0085590 A1     Mar. 26, 2015

(30) Foreign Application Priority Data

Sep. 24, 2013 (KR) .................. 10-2013-0113305

(51) Int. Cl.
*G11C 7/10* (2006.01)
*G11C 7/06* (2006.01)

(52) U.S. Cl.
CPC ............... *G11C 7/06* (2013.01); *G11C 7/1048* (2013.01); *G11C 2207/005* (2013.01)

(58) Field of Classification Search
CPC ... G11C 7/06; G11C 7/1048; G11C 2207/005
USPC .......... 365/191, 189.05, 189.14, 189.15, 190, 365/205
See application file for complete search history.

(56) References Cited

U.S. PATENT DOCUMENTS

| | | | | |
|---|---|---|---|---|
| 5,036,494 A * | 7/1991 | Wise | ......... | G11C 7/10 365/194 |
| 5,077,689 A * | 12/1991 | Ahn | ......... | G11C 7/1048 365/189.05 |
| 5,646,900 A * | 7/1997 | Tsukude | ......... | G11C 7/065 365/189.09 |
| 5,798,978 A * | 8/1998 | Yoo | ......... | G11C 8/18 365/193 |
| 5,946,254 A * | 8/1999 | Tsuchida | ......... | G11C 7/18 365/149 |
| 6,445,632 B2 * | 9/2002 | Sakamoto | ......... | G11C 7/00 365/191 |
| 2001/0005012 A1 * | 6/2001 | Ohshima | ......... | G11C 7/1039 257/1 |
| 2002/0003747 A1 * | 1/2002 | Yahata | ......... | G11C 7/1066 365/233.1 |
| 2005/0068814 A1 * | 3/2005 | Chatterjee | ......... | G11C 7/12 365/200 |
| 2006/0023555 A1 * | 2/2006 | Morishima | ......... | 365/230.03 |
| 2006/0083091 A1 * | 4/2006 | Edahiro | ......... | G11C 7/12 365/203 |
| 2007/0121394 A1 * | 5/2007 | Noda | ......... | G11C 7/1051 365/194 |
| 2008/0056037 A1 | 3/2008 | Chang | | |
| 2008/0123439 A1 * | 5/2008 | Park | ......... | G11C 7/1048 365/189.011 |
| 2009/0259895 A1 * | 10/2009 | Jung | ......... | G11C 29/1201 714/718 |
| 2010/0182855 A1 * | 7/2010 | Koshizuka | ......... | G11C 7/1051 365/193 |
| 2012/0026777 A1 * | 2/2012 | Kitagawa | ......... | G11C 13/0009 365/148 |
| 2013/0015541 A1 * | 1/2013 | Kanaya | ......... | H01L 43/08 257/421 |

FOREIGN PATENT DOCUMENTS

KR    1020040090425 A    10/2004

* cited by examiner

*Primary Examiner* — Vu Le
*Assistant Examiner* — Sung Cho
(74) *Attorney, Agent, or Firm* — William Park & Associates Ltd.

(57) ABSTRACT

Semiconductor systems are provided. The semiconductor system includes a controller and a semiconductor device. The controller is suitable for generating command signals and address signals. The semiconductor device is suitable for electrically disconnecting a first local line from a second local line in response to an input control signal enabled in a read mode. The read mode is set according to a logic combination of the command signals. Further, the semiconductor device is suitable for sensing and amplifying a data on the first local line or the second local line according to the address signals to output the amplified data through an input/output line.

20 Claims, 5 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2013-0113305, filed on Sep. 24, 2013, in the Korean Intellectual Property Office, which is incorporated herein by reference in its entirety.

BACKGROUND

1. Technical Field

Embodiments of the present disclosure generally relate to semiconductor devices and semiconductor systems including the same.

2. Related Art

Currently known semiconductor devices may execute a write operation to store data therein and, likewise, may execute a read operation to output the data stored therein. To execute the write operation or the read operation, the semiconductor devices may selectively enable a word line using a row address signal to create a row path. Alternatively, the semiconductor devices may activate a switching element, coupled between a sense amplifier and an input/output (I/O) line, using a column selection signal generated by a column address signal. Upon activation of the switching element as described, the semiconductor devices may then create a column path.

Each of the semiconductor devices may be designed to include several input/output ("I/O") lines for outputting data. Further, the devices may also include sense amplifiers that may sense and amplify a voltage difference ($\Delta V$) between a pair of I/O lines selected by a column address signal. The sense amplifiers may then output the data during the read operation.

During the read operation of the semiconductor device, at least one of the I/O lines may be selected by the column address signal while the remaining I/O lines may remain non-selected. In such an instance, a loading capacitance between the selected I/O line and the non-selected I/O lines adjacent thereto may degrade a function of the sense amplifier to increase a data access time of the semiconductor device.

SUMMARY

Various embodiments are directed to semiconductor devices and semiconductor systems including the same.

According to some embodiments, a semiconductor system includes a controller and a semiconductor device. The controller is suitable for generating command signals and address signals. The semiconductor device is suitable for electrically disconnecting a first local line from a second local line in response to an input control signal. Such an electrical disconnect occurs when the input control signal is enabled in a read mode set according to a logic combination of the command signals. Further, the semiconductor device is suitable for sensing and amplifying a data on the first local line or the second local line according to the address signals to output the amplified data through an input/output line.

According to several embodiments, a semiconductor device includes a command decoder, an address decoder, an input/output controller and a data input/output unit. The command decoder is suitable for decoding command signals supplied from an external device to generate a read signal enabled in a read mode. Similarly, the address decoder is suitable for decoding the address signals supplied from the external device to generate internal address signals. The input/output controller is suitable for generating an input control signal in response to the read signal. Further, the input/output controller is suitable for generating a first column selection signal group and a second column selection signal group in response to the internal address signals. One signal of the first column selection signal group and one signal of the second column selection signal group are selectively enabled according to the internal address signals. The data input/output unit is suitable for sensing and amplifying a data loaded on a first local line to output an amplified signal of the data on the first local line through an input/output line when one signal of the first column selection signal group is enabled. Further, the data input/output unit is suitable for sensing and amplifying a data loaded on a second local line to output an amplified signal of the data on the second local line through the input/output line when one signal of the second column selection signal group is enabled.

Moreover, a method for operating a semiconductor device is provided. The method includes generating a command signal and an address signal by a controller and configuring the semiconductor device to electrically disconnect a first local line from a second local line in response to an input control signal wherein the input control signal is enabled in a read mode. A logic combination of the command signal sets the read mode and a command decoder decodes the command signal to generate a read signal.

The method decodes the address signal with an address decoder to generate an internal address signal, generates an input control signal in response to the read signal by an input/output controller and senses and amplifies a data by a data input/output unit on the first local line or the second local line according to the address signal to output the amplified data through an input/output line.

BRIEF DESCRIPTION OF THE DRAWINGS

Embodiments of the present invention will become more apparent in view of the attached drawings and accompanying detailed description, in which.

DETAILED DESCRIPTION

Various embodiments of the present invention will be described herein with reference to the accompanying drawings. However, the embodiments described herein are for illustrative purposes only and are not intended to limit the scope of the present invention.

Figure 1:
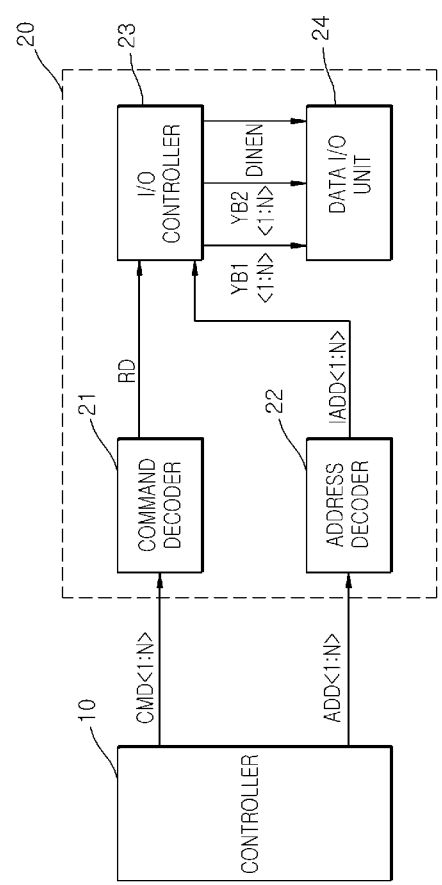
FIG. 1 is a block diagram illustrating a semiconductor system according to an embodiment of the present invention.

Referring to FIG. 1, a semiconductor system according to the present embodiment may include a controller 10 and a semiconductor device 20.

The controller 10 may generate command signals CMD<1:N> and address signals ADD<1:N> to apply the command signals CMD<1:N> and the address signals ADD<1:N> to the semiconductor device 20 (wherein, "N" denotes a natural number which is equal to or greater than two).

The semiconductor device 20 may include a command decoder 21, an address decoder 22, an input/output (I/O) controller 23 and a data I/O unit 24. The command decoder 21 may generate a read signal RD enabled in a read mode which is set according to a logic combination of the command signals CMD<1:N>. The address decoder 22 may decode the address signals ADD<1:N> to generate internal address signals IADD<1:N>. The I/O controller 23 may generate an input control signal DINEN enabled when the read signal RD is inputted thereto. Further, the I/O controller 23 may generate a first column selection signal group YB1<1:N>, one signal of which is selectively enabled according to a logic combination of the internal address signals IADD<1:N> and may generate a second column selection signal group YB2<1 N>, one signal of which is selectively enabled according to a logic combination of the internal address signals IADD<1: N>. The data I/O unit 24 may sense and amplify data of local lines in response to the first and second column selection signal groups YB1<1:N> and YB2<1:N> to output the amplified data. The input control signal DINEN may be disabled in a write mode.

A configuration of the data I/O unit 24 will be described more fully herein with reference to FIG. 2.

Figure 2:
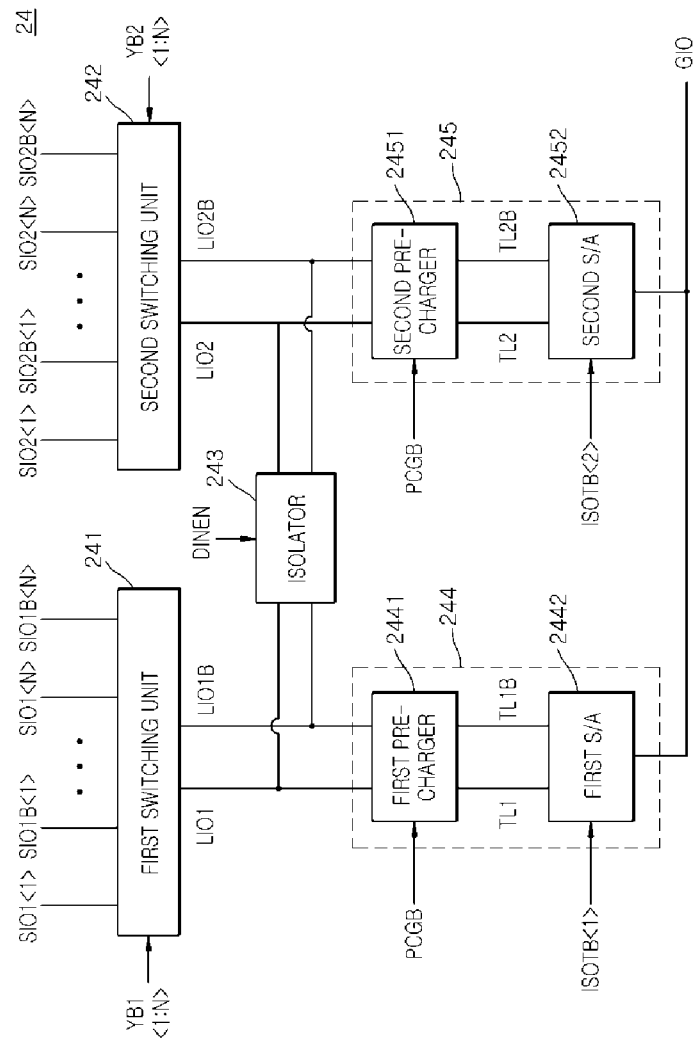
FIG. 2 is a block diagram illustrating a data I/O unit included in the semiconductor system of FIG. 1.

Referring to FIG. 2, the data I/O unit 24 may include a first switching unit 241, a second switching unit 242, an isolator 243, a first I/O line driver 244 and a second I/O line driver 245.

The first switching unit 241 may electrically connect a pair of segment lines selected from a first segment line group SIO1<1>, SIO1B<1>~SIO1<N>, SIO1B<N> according to the enabled column selection signal of the first column selection signal group YB1<1:N> to a pair of first local lines LIO1 and LIO1B. The first segment line group SIO1<1>, SIO1B<1>~SIO1<N>, SIO1B<N> may correspond to data transmission lines that are electrically connected to memory cells of the semiconductor device 20 to input or output the data. In the first segment line group SIO1<1>, SIO1B<1>~SIO1<N>, SIO1B<N>, complementary segment lines SIO1B<1 >~SIO1B<N> may be data transmission lines having complementary levels of signals transmitted through the segment lines SIO1<1>~SIO1<N>, respectively.

The second switching unit 242 may electrically connect a pair of segment lines selected from a second segment line group SIO2<1>, SIO2B<1>~SIO2<N>, SIO2B<N> according to the enabled column selection signal of the second column selection signal group YB2<1:N> to a pair of second local lines LIO2 and LIO2B. The second segment line group SIO2<1>, SIO2B<1>~SIO2<N>, SIO2B<N> may correspond to data transmission lines that are electrically connected to memory cells of the semiconductor device 20 to input or output the data. In the second segment line group SIO2<1>, SIO2B<1>~SIO2<N>, SIO2B<N>, complementary segment lines SIO2B<1>~SIO2B<N> may be data transmission lines having complementary levels of signals transmitted through the segment lines SIO2<1>~SIO2<N>, respectively.

The isolator 243 may electrically disconnect the first local lines LIO1 and LIO1B from the second local lines LIO2 and LIO2B in response to the input control signal DINEN (e.g. DINEN is enabled when the semiconductor device 20 operates in the read mode).

The first I/O line driver 244 may include a first pre-charger 2441 and a first sense amplifier (S/A) 2442. The first pre-charger 2441 may pre-charge the pair of first local lines LIO1 and LIO1B to a level which is lower than that of a power supply voltage VDD in a pre-charge mode. The first S/A 2442 may sense and amplify a voltage difference (ΔV) between a pair of first transmission lines TL1 and TL1B, which are driven to have a lower level than the pair of first local lines LIO1 and LIO1B in the read mode, to drive an I/O line GIO. The power supply voltage VDD may be generated in the semiconductor device 20 or may be supplied from an external device.

The second I/O line driver 245 may include a second pre-charger 2451 and a second sense amplifier (S/A) 2452. The second pre-charger 2451 may pre-charge the pair of second local lines LIO2 and LIO2B to a level which is lower than that of the power supply voltage VDD in the pre-charge mode. The second S/A 2452 may sense and amplify a voltage difference (ΔV) between a pair of second transmission lines TL2 and TL2B, where the second transmission lines TL2 and TL2B are driven to have a lower level than the pair of second local lines LIO2 and LIO2B in the read mode, and also to drive the I/O line GIO.

A configuration of the isolator 243 will be described more fully herein with reference to FIG. 3.

Figure 3:
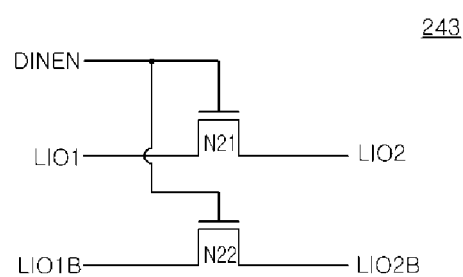
FIG. 3 is a circuit diagram illustrating an isolator included in the data I/O unit of FIG. 2.

Referring to FIG. 3, the isolator 243 may include a first switching element N21 and a second switching element N22. The first switching element N21 may be turned off in response to the input control signal DINEN enabled to have a logic "low" level in the read mode to electrically disconnect the first local line LIO1 from the second local line LIO2. The second switching element N22 may be turned off in response to the input control signal DINEN disabled to have a logic "low" level in the read mode to electrically disconnect the first complementary local line LIO1B from the second complementary local line LIO2B. The first and second complementary local lines LIO1B and LIO2B may be data transmission lines having complementary levels of signals transmitted through the first and second local lines LIO1 and LIO2, respectively.

A configuration of the first pre-charger 2441 will be described more fully hereinafter with reference to FIG. 4.

Figure 4:
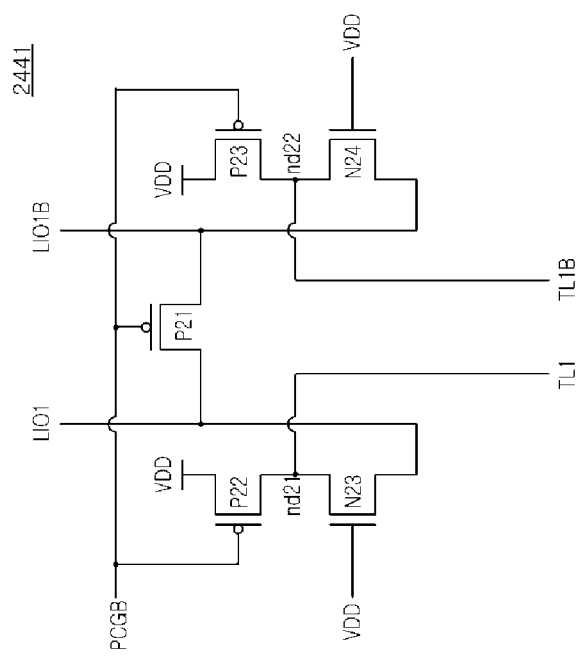
FIG. 4 is a circuit diagram illustrating a first pre-charger included in the data I/O unit of FIG. 2.

Referring to FIG. 4, the first pre-charger 2441 may include a PMOS transistor P21, a PMOS transistor P22, a PMOS transistor P23, an NMOS transistor N23 and an NMOS transistor N24. The PMOS transistor P21 may be coupled between the first local line LIO1 and the first complementary local line LIO1B and may be turned on in response to a pre-charge signal PCGB enabled to have a logic "low" level in a pre-charge mode to electrically connect the first local line LIO1 to the first complementary local line LIO1B.

The PMOS transistor P22 may be coupled between a power supply voltage VDD terminal and a node ND21 and may be turned on in response to the pre-charge signal PCGB having a logic "low" level to drive the node ND21 electrically connected to the first transmission line TL1 to have the power supply voltage VDD.

The PMOS transistor P23 may be coupled between the power supply voltage VDD terminal and a node ND22 and may be turned on in response to the pre-charge signal PCGB having a logic "low" level to drive the node ND22 electrically connected to the first complementary transmission line TL1B to have the power supply voltage VDD.

The NMOS transistor N23 may be coupled between the node ND21 and the first local line LIO1 and may be turned on in response to the power supply voltage VDD signal to electrically connect the first local line LIO1 to the first transmission line TL1.

The NMOS transistor N24 may be coupled between the node ND22 and the first complementary local line LIO1B and may be turned on in response to the power supply voltage VDD signal to electrically connect the first complementary local line LIO1B to the first complementary transmission line TL1B.

Further explained, in the pre-charge mode, the first pre-charger 2441 may drive the first local line LIO1 to have a level which is lower than the power supply voltage VDD by a threshold voltage (Vt) of the NMOS transistor N23 and may drive the first complementary local line LIO1B to have a level which is lower than the power supply voltage VDD by a threshold voltage (Vt) of the NMOS transistor N24. Further, in the read mode, the first pre-charger 2441 may drive the first transmission line TL1 to have a level which is lower than that of the first local line LIO1 by a threshold voltage (Vt) of the NMOS transistor N23 and may drive the first complementary transmission line TL1B to have a level which is lower than that of the first complementary local line LIO1B by a threshold voltage (Vt) of the NMOS transistor N24.

A configuration of the second pre-charger 2451 will be described more fully hereinafter with reference to FIG. 5.

Figure 5:
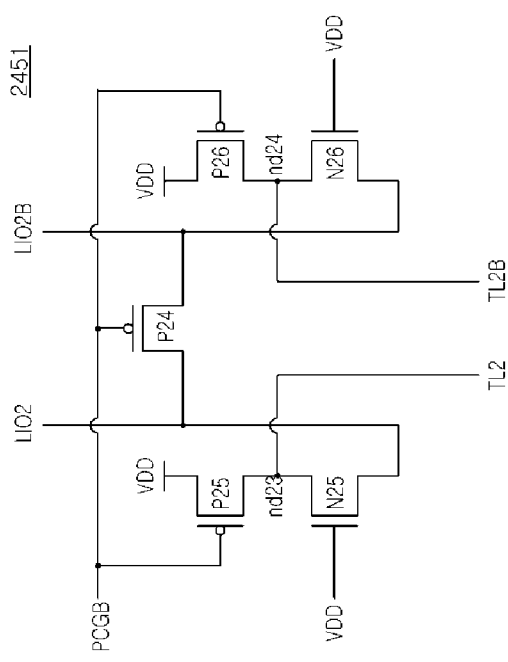
FIG. 5 is a circuit diagram illustrating a second pre-charger included in the data I/O unit of FIG. 2.

Referring to FIG. 5, the second pre-charger 2451 may include a PMOS transistor P24, a PMOS transistor P25, a PMOS transistor P26, an NMOS transistor N25 and an NMOS transistor N26.

The PMOS transistor P24 may be coupled between the second local line LIO2 and the second complementary local line LIO2B and may be turned on in response to the pre-charge signal PCGB enabled to have a logic "low" level in the pre-charge mode to electrically connect the second local line LIO2 to the second complementary local line LIO2B.

The PMOS transistor P25 may be coupled between the power supply voltage VDD terminal and a node ND23 and may be turned on in response to the pre-charge signal PCGB having a logic "low" level to drive the node ND23 electrically connected to the second transmission line TL2 to have the power supply voltage VDD.

The PMOS transistor P26 may be coupled between the power supply voltage VDD terminal and a node ND24 and may be turned on in response to the pre-charge signal PCGB having a logic "low" level to drive the node ND24 electrically connected to the second complementary transmission line TL2B to have the power supply voltage VDD.

The NMOS transistor N25 may be coupled between the node ND23 and the second local line LIO2 and may be turned on in response to the power supply voltage VDD signal to electrically connect the second local line LIO2 to the second transmission line TL2.

The NMOS transistor N26 may be coupled between the node ND24 and the second complementary local line LIO2B and may be turned on in response to the power supply voltage VDD signal to electrically connect the second complementary local line LIO2B to the second complementary transmission line TL2B. Further explained, in the pre-charge mode, the second pre-charger 2451 may drive the second local line LIO2 to have a level which is lower than the power supply voltage VDD by a threshold voltage (Vt) of the NMOS transistor N25 and may drive the second complementary local line LIO2B to have a level which is lower than the power supply voltage VDD by a threshold voltage (Vt) of the NMOS transistor N26. Further, in the read mode, the second pre-charger 2451 may drive the second transmission line TL2 to have a level which is lower than that of the second local line LIO2 by a threshold voltage (Vt) of the NMOS transistor N25 and may drive the second complementary transmission line TL2B to have a level which is lower than that of the second complementary local line LIO2B by a threshold voltage (Vt) of the NMOS transistor N26.

Operations of the semiconductor system having the aforementioned configuration will be described hereinafter with reference to FIGS. 1 to 5 in relation to the pre-charge mode and the read mode. In the read mode, a data on the first local line LIO1 will be outputted through the I/O line GIO.

First, an operation of the pre-charge mode will be described hereinafter in conjunction with an example that the pre-charge signal PCGB is enabled to have a logic "low" level.

As illustrated in FIG. 4, the PMOS transistor P21 of the first pre-charger 2441 may be turned on in response to the pre-charge signal PCGB having a logic "low" level to electrically connect the first local line LIO1 to the first complementary local line LIO1B. The PMOS transistor P22 may be turned on in response to the pre-charge signal PCGB having a logic "low" level to drive the node ND21 to have the power supply voltage VDD. The NMOS transistor N23 may be turned on in response to the power supply voltage VDD signal to drive the first local line LIO1 to have a level which is lower than the power supply voltage VDD by a threshold voltage (Vt) thereof. The PMOS transistor P23 may be turned on in response to the pre-charge signal PCGB having a logic "low" level to drive the node nd22 to have the power supply voltage VDD. The NMOS transistor N24 may be turned on in response to the power supply voltage VDD signal to drive the first complementary local line LIO1B to have a level which is lower than the power supply voltage VDD by a threshold voltage (Vt) thereof.

Further explained, in the pre-charge mode, the first pre-charger 2441 may drive the first local line LIO1 to have a level which is lower than the power supply voltage VDD by a threshold voltage (Vt) of the NMOS transistor N23 and may drive the first complementary local line LIO1B to have a level which is lower than the power supply voltage VDD by a threshold voltage (Vt) of the NMOS transistor N24.

As shown in FIG. 5, the PMOS transistor P24 of the second pre-charger 2451 may be turned on in response to the pre-charge signal PCGB having a logic "low" level to electrically connect the second local line LIO2 to the second complementary local line LIO2B. The PMOS transistor P25 may be turned on in response to the pre-charge signal PCGB having a logic "low" level to drive the node nd23 to have the power supply voltage VDD. The NMOS transistor N25 may be turned on in response to the power supply voltage VDD signal to drive the second local line LIO2 to have a level which is lower than the power supply voltage VDD by a threshold voltage (Vt) thereof. The PMOS transistor P26 may be turned on in response to the pre-charge signal PCGB having a logic "low" level to drive the node nd24 to have the power supply voltage VDD. The NMOS transistor N26 may be turned on in response to the power supply voltage VDD signal to drive the second complementary local line LIO2B to have a level which is lower than the power supply voltage VDD by a threshold voltage (Vt) thereof.

Further explained, in the pre-charge mode, the second pre-charger 2451 may drive the second local line LIO2 to have a level which is lower than the power supply voltage VDD by a threshold voltage (Vt) of the NMOS transistor N25 and may also drive the second complementary local line LIO2B to have a level which is lower than the power supply voltage VDD by a threshold voltage (Vt) of the NMOS transistor N26.

Returning now to FIG. 4, and as described above, when the semiconductor system operates in the pre-charge mode, the first local line LIO1 and the first complementary local line LIO1B may be driven to have a lower level than the power supply voltage VDD by a threshold voltage (Vt) of the NMOS transistor N23 and a lower level than the power supply voltage VDD by a threshold voltage (Vt) of the NMOS transistor N24, respectively. Further, when the semiconductor system operates in the pre-charge mode, the second local line LIO2 and the second complementary local line LIO2B may be driven to have a lower level than the power supply voltage VDD by a threshold voltage (Vt) of the NMOS transistor N25 and a lower level than the power supply voltage VDD by a threshold voltage (Vt) of the NMOS transistor N26, respectively. Thus, as discussed here, power consumption of the semiconductor system may be reduced in the pre-charge mode.

Next, as shown in FIG. 1, an operation of the read mode will be described herein with an example that a data on the first local line LIO1 is outputted through the I/O line GIO.

The controller 10 may apply the command signals CMD<1:N> for putting the semiconductor device 20 in the read mode and the address signals ADD<1:N> for outputting the data on the first local line LIO1 to the semiconductor device 20.

The command decoder 21 may decode the command signals CMD<1:N> to generate the read signal RD.

The address decoder 22 may decode the address signals ADD<1:N> to generate the internal address signals IADD<1:N>.

The I/O controller 23 may receive the read signal RD to generate the input control signal DINEN having a logic "low" level (i.e., a low voltage level) and to generate the first column selection signal group YB1<1:N> such that any one signal of the first column selection signal group YB1<1:N> has a logic "high" level (i.e., a high voltage level) according to a logic combination of the internal address signals IADD<1:N>.

As illustrated in FIG. 2, the first switching unit 241 may electrically connect the first local line LIO1 to one line of the first segment line group SIO1<1>~SIO1<N>, which is selected by the first column selection signal group YB1<1:N> including a column selection signal generated to have a logic "high" level and may electrically connect the first complementary local line LIO1B to one line of the first complementary segment line group SIO1B<1>~SIO1B<N>, which corresponds to a complementary line of the selected first segment line.

The second switching unit 242 may electrically disconnect the second local line LIO2 and the second complementary local line LIO2B from the second segment line group SIO2<1>18 SIO2<N> and the second complementary segment line group SIO2B<1>~SIO2B<N> because all signals of the second column selection signal group YB2<1:N> have a logic "low" level.

As shown in FIG. 3, the first switching element N21 of the isolator 243 may be turned off in response to the input control signal DINEN having a logic "low" level to electrically disconnect the first local line LIO1 from the second local line LIO2. The second switching element N22 may be turned off in response to the input control signal DINEN having a logic "low" level to electrically disconnect the first complementary local line LIO1B from the second complementary local line LIO2B.

As illustrated in FIGS. 2 and 4, the NMOS transistor N23 of the first pre-charger 2441 may be turned on in response to the power supply voltage VDD signal to drive the first transmission line TL1 to have a level which is lower than that of the first local line LIO1 by a threshold voltage (Vt) of the NMOS transistor N23. As shown in FIG. 4, the NMOS transistor N24 of the first pre-charger 2441 may be turned on in response to the power supply voltage VDD signal to drive the first complementary transmission line TL1B to have a level which is lower than that of the first complementary local line LIO1B by a threshold voltage (Vt) of the NMOS transistor N24. In such a case, the PMOS transistors P21, P22 and P23 of the first pre-charger 2441 may be turned off.

As illustrated in FIGS. 2 and 5, the first S/A 2442 may sense and amplify a voltage difference (ΔV) between the first transmission line TL1 and the first complementary transmission line TL1B to output the amplified data of the signal on the first transmission line TL1 through the I/O line GIO.

The NMOS transistor N25 of the second pre-charger 2451 may be turned on in response to the power supply voltage VDD signal to drive the second transmission line TL2 to have a level which is lower than that of the second local line LIO2 by a threshold voltage (Vt) of the NMOS transistor N25. The NMOS transistor N26 of the second pre-charger 2451 may be turned on in response to the power supply voltage VDD signal to drive the second complementary transmission line TL2B to have a level which is lower than that of the second complementary local line LIO2B by a threshold voltage (Vt) of the NMOS transistor N26. In such a case, the PMOS transistors P24, P25 and P26 of the second pre-charger 2451 may be turned off.

The second S/A 2452 does not operate where is no voltage difference (ΔV) between the first transmission line TL1 and the first complementary transmission line TL1B.

As described above, the semiconductor system having the aforementioned configuration may electrically disconnect the first local line LIO1 from the second local line LIO2 and may electrically disconnect the first complementary local line LIO1B from the second complementary local line LIO2B in the read mode. Thus, as shown here, a parasitic capacitance of the selected local lines may be reduced to enhance a data access time of the semiconductor system.

It is important to note that the semiconductor system described above in relation to FIGS. 1-5 is merely one example of a system having a controller and a semiconductor device composed of a command decoder, an address decoder, an input/output controller and a data input/output unit. In alternative embodiments, such as in other semiconductor systems, the selection and/or orientation of the components listed may differ from the embodiments shown in FIGS. 1-5 without departing from the original scope and spirit of the invention.

What is claimed is:

1. A semiconductor system comprising:
a controller suitable for generating command signal and an address signal;
a semiconductor device suitable for electrically disconnecting a first local line from a second local line in response to an input control signal enabled in a read mode,
wherein the semiconductor device suitable for electrically connecting the first local line and the second local line in response to the input control signal disabled in a write mode;
further wherein the read mode is set in accordance with a logic combination of the command signal; and
further wherein the semiconductor device suitable for sensing and amplifying a data on the first local line or the second local line in accordance with the address signal to output the amplified data through an input/output line.

2. The semiconductor system of claim 1, wherein the write mode is set according to a logic combination of the command signals.

3. The semiconductor system of claim 1, wherein the semiconductor device further comprises:

a command decoder suitable for decoding the command signal to generate a read signal, wherein the read signal is enabled in the read mode;

an address decoder suitable for decoding the address signal to generate an internal address signal;

an input/output controller suitable for generating the input control signal in response to the read signal and suitable for generating a first column selection signal group and a second column selection signal group in response to the internal address signal, a first signal corresponding to the first column selection signal group and a second signal corresponding to the second column selection signal group further wherein the first signal and the second signal are selectively enabled according to the internal address signal; and a data input/output unit suitable for sensing and amplifying a first data loaded on the first local line to output a first amplified signal of the first data on the first local line through the input/output line when a first signal of the first column selection signal group is enabled, further wherein the data input/output unit suitable for sensing and amplifying a second data loaded on the second local line to output a second amplified signal of the second data on the second local line through the input/output line when a second signal of the second column selection signal group is enabled.

4. The semiconductor system of claim 3, wherein the data input/output unit further comprises:

a first switching unit suitable for electrically connecting a first segment line from a first segment line group to the first local line according to a logic combination of the first column selection signal group;

a second switching unit suitable for electrically connecting a second segment line of a second segment line group to the second local line according to a logic combination of the second column selection signal group; and an isolator suitable for electrically disconnecting the first local line from the second local line in response to the input control signal.

5. The semiconductor system of claim 4 wherein the isolator includes a switching element coupled between the first local line and the second local line; and wherein the switching element is turned on in response to the input control signal.

6. The semiconductor system of claim 4, wherein the data input/output unit further comprises:

a first input/output line driver suitable for driving a first transmission line to have a first voltage level lower than that of the first local line in the read mode, wherein the first input/output line driver suitable for sensing and amplifying the first voltage level of the first transmission line to output the amplified level of the first transmission line through the input/output line; and a second input/output line driver suitable for driving a second transmission line to have a second voltage level lower than that of the second local line in the read mode and suitable for sensing and amplifying a level of the second transmission line to output the amplified level of the second transmission line through the input/output line.

7. The semiconductor system of claim 6, wherein the first input/output line driver further comprises:

a first drive element coupled between the first local line and a first node connected to the first transmission line.

8. The semiconductor system of claim 7, wherein the first input/output line driver drives the first local line to have the first voltage level lower than a power supply voltage as determined by a threshold voltage of the first drive element in a pre-charge mode.

9. The semiconductor system of claim 6, wherein the second input/output line driver further comprises:

a second drive element coupled between the second local line and a second node connected to the second transmission line.

10. The semiconductor system of claim 9, wherein the second input/output line driver drives the second local line to have the second voltage level which is lower than a power supply voltage by a threshold voltage of the second drive element in a pre-charge mode.

11. An apparatus including a semiconductor device, comprising:

a command decoder suitable for decoding a command signal supplied from an external device to generate a read signal wherein the read signal is enabled in a read mode;

an address decoder suitable for decoding an address signal supplied from the external device to generate an internal address signal;

an input/output controller suitable for generating an input control signal in response to the read signal wherein the input/output controller further suitable for generating a first column selection signal group and a second column selection signal group in response to the internal address signal, wherein one signal of the first column selection signal group and one signal of the second column selection signal group are selectively enabled according to the internal address signal; and a data input/output unit suitable for sensing and amplifying a first data loaded on a first local line to output a first amplified signal of the first data on the first local line through an input/output line when a first signal of the first column selection signal group is enabled and suitable for sensing and amplifying a second data loaded on a second local line to output a second amplified signal of the second data on the second local line through the input/output line when a second signal of the second column selection signal group is enabled, further wherein the data input/output unit suitable for electrically disconnecting the first local line from the second local line in response to the input control signal enabled in a read mode and suitable for electrically connecting the first local line and the second local line in response to the input control signal disabled in a write mode.

12. The semiconductor device of claim 11, wherein the write mode is set according to a logic combination of the command signals.

13. The semiconductor device of claim 11, wherein the data input/output unit further comprises:

a first switching unit suitable for electrically connecting a first segment line from a first segment line group to the first local line according to a logic combination of the first column selection signal group;

a second switching unit suitable for electrically connecting a second segment line of a second segment line group to the second local line according to a logic combination of the second column selection signal group; and an isolator suitable for electrically disconnecting the first local line from the second local line in response to the input control signal.

14. The semiconductor device of claim 13, wherein the isolator includes a switching element coupled between the first local line and the second local line; and further wherein the switching element is turned on in response to the input control signal.

15. The semiconductor device of claim 13, wherein the data input/output unit further includes:
   a first input/output line driver suitable for driving a first transmission line to have a voltage level lower than that of the first local line in the read mode and wherein the first input/output line driver suitable for sensing and amplifying a level of the first transmission line to output the amplified level of the first transmission line through the input/output line; and
   a second input/output line driver suitable for driving a second transmission line to have a voltage level lower than that of the second local line in the read mode wherein the second input/output line driver suitable for sensing and amplifying a level of the second transmission line to output the amplified level of the second transmission line through the input/output line.

16. The semiconductor device of claim 15, wherein the first input/output line driver further comprises:
   a first drive element coupled between the first local line and a first node connected to the first transmission line.

17. The semiconductor device of claim 16, wherein the first input/output line driver drives the first local line to have a voltage lower than a power supply voltage by a threshold voltage of the first drive element in a pre-charge mode.

18. The semiconductor device of claim 15, wherein the second input/output line driver further comprises:
   a second drive element coupled between the second local line and a second node connected to the second transmission line.

19. The semiconductor device of claim 18, wherein the second input/output line driver drives the second local line to have a voltage level lower than a power supply voltage by a threshold voltage of the second drive element in a pre-charge mode.

20. A method for operating a semiconductor device, comprising:
   generating a command signal and an address signal by a controller;
   configuring a semiconductor device to electrically disconnect a first local line from a second local line in response to an input control signal wherein the input control signal is enabled in a read mode;
   wherein the semiconductor device suitable for electrically connect the first local line and the second local line in response to the input control signal disabled in a write mode;
   setting the read mode according to a logic combination of the command signal;
   decoding the command signal with a command decoder to generate a read signal;
   decoding the address signal with an address decoder to generate an internal address signal;
   generating an input control signal in response to the read signal by an input/output controller; and
   sensing and amplifying a data by a data input/output unit on the first local line or the second local line according to the address signal to output the amplified data through an input/output line.

* * * * *